United States Patent
Arigliano

(10) Patent No.: US 7,129,775 B2
(45) Date of Patent: Oct. 31, 2006

(54) SELF-MIRRORING CURRENT MIRROR

(75) Inventor: Antonello Arigliano, Germering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 40 days.

(21) Appl. No.: 10/874,473

(22) Filed: Jun. 22, 2004

(65) Prior Publication Data

US 2005/0275451 A1   Dec. 15, 2005

(30) Foreign Application Priority Data

Jun. 14, 2004  (EP) ................... 04392029

(51) Int. Cl.
- *G05F 1/10* (2006.01)
- *G05F 3/16* (2006.01)
- *G06F 19/00* (2006.01)

(52) U.S. Cl. .................... 327/543; 327/538
(58) Field of Classification Search ........ 327/538, 327/427, 530, 543; 324/713
See application file for complete search history.

(56) References Cited

U.S. PATENT DOCUMENTS

| | | | |
|---|---|---|---|
| 5,159,516 A | 10/1992 | Fujihira | 361/18 |
| 5,285,143 A * | 2/1994 | Bahr et al. | 318/805 |
| 5,644,269 A * | 7/1997 | Wong et al. | 330/261 |
| 5,712,556 A * | 1/1998 | Okamura | 323/314 |
| 6,392,392 B1 | 5/2002 | Nakahara | 323/312 |
| 6,479,975 B1 | 11/2002 | Plankensteiner et al. | 323/316 |
| 6,480,038 B1 * | 11/2002 | Horn | 327/66 |
| 6,531,885 B1 | 3/2003 | Manhaeve et al. | 324/763 |
| 6,968,249 B1 * | 11/2005 | Nishino et al. | 700/108 |

FOREIGN PATENT DOCUMENTS

EP            419093 A      3/1991

* cited by examiner

*Primary Examiner*—Dinh T. Le
(74) *Attorney, Agent, or Firm*—Saile Ackerman LLC; Stephen B. Ackerman

(57) ABSTRACT

A circuit and a related method to measure efficiently a load current in an integrated circuit using a current mirror configuration has been achieved. The current mirror configuration comprises three branches, a biasing branch, a load branch, and a measurement branch. The biasing branch comprises a current source and two transistors, the load branch comprises a load and two transistors, and the measurement branch comprises a means of measurement and two transistors. The biasing branch is attached to the load branch in a cascode mirror configuration and the measurement branch is also attached to the load branch in a cascode mirror configuration. The current in the measurement branch is linearly correlated to the current in the load branch and provides therefore an efficient way to measure the load current without any distortion of the load current.

13 Claims, 1 Drawing Sheet

SELF-MIRRORING CURRENT MIRROR

BACKGROUND OF THE INVENTION (1) Field of the Invention

This invention relates generally to current mirrors and relates more particularly to the measurement of the load current of current mirrors.

(2) Description of the Prior Art

Current mirrors are the most widely use analog circuit. Most of the transistors in an analog integrated circuit are parts of current mirrors. A current mirror may be thought of as an adjustable current regulator, the current limit being easily set by a single resistance.

Current mirrors are used as current sources. An ideal current source has infinite output impedance. That is, the output current does not change, even for large swings in output voltage. This means that actual current mirrors have very high impedance.

A challenge to the designers of electronic circuits is to define a low-cost solution to measure a load current, especially in integrated circuits, without impacting the load current. Current mirrors can offer a solution to this task. This is especially important for diagnostic and safety circuits, especially for short circuit detection. There are various patents in regard of this area.

U.S. Pat. No. 6,531,885 (to Manheuve et al.) describes an apparatus and method for testing supply connections of an electronic device by using a current mirror configuration through using a particular connection of the branches of the current mirror to the supply line. Such connection results in unbalanced operation of the current mirror but depending whether the supply connection under test is proper or not, the unbalance is essentially different, resulting in a high sensitivity of the test device.

U.S. Pat. No. 6,392,392 (to Nakahara) discloses an over-current detecting circuit (OCD Circuit) for comparing a voltage drop by an ON-state resistance of an output transistor with a reference voltage, to detect an over-current state of the output transistor. This OCD Circuit is provided with a first power source and an RVG Circuit, which outputs a first reference voltage on the basis of a voltage supplied from the first power source. The OCD Circuit is also provided with a constant-current source which generates a constant current having a second temperature characteristic on the basis of the first reference voltage, and a current mirror circuit which inputs the constant current. Moreover, the OCD Circuit is provided with a current-voltage converting circuit, which converts an output current from the current mirror circuit, to a voltage and outputs a reference voltage, which has a temperature characteristic in proportion to the second temperature characteristic. A first temperature characteristic of the output transistor is compensated by the temperature characteristic of the reference voltage.

U.S. Pat. No. 5,159,516 (to Fujihira) describes an improved over-current-detection circuit for detecting over-current condition of a main current flowing through a semiconductor power device using a constant-current device to provide a proportionally enhanced potential difference representative of increases in such current. The proportionally enhanced potential difference increases the accuracy of measuring the current flowing between first and second main-current terminals of the semiconductor power device, thereby providing more accurate over-current detection, without requiring an increase in the accuracy of a voltage comparator. The power semiconductor device is coupled to a current-mirror element having a shunt-current terminal. The over-current-detection circuit incorporates a constant-current device connected between the second main-current terminal and the shunt-current terminal. The constant-current device maintains the shunt current at a substantially constant level, after the shunt current rises to a predetermined level. The over-current-detection circuit also incorporates determining means, which is coupled across the constant-current device and includes a voltage comparator. The voltage comparator provides an over-current-detection signal when the potential difference across the constant-current device exceeds a predetermined voltage. The over-current-detection signal is used to control the main current of the semiconductor power device. The invention provides an over-current-detection circuit with superior over-current-detection accuracy using conventional power-IC manufacturing technology.

SUMMARY OF THE INVENTION

A principal objective of the present invention is to achieve a circuit to measure efficiently a load current in an integrated circuit.

A further objective of the present invention is to achieve a method to measure efficiently a load current in an integrated circuit.

In accordance with the objects of this invention a circuit of a current mirror configuration having three branches to measure a load current in an integrated circuit has been achieved. The circuit invented comprises, firstly, a first biasing branch comprising a current source and two CMOS transistors, wherein the current source is connected between $V_{DD}$ voltage and the drain of a first transistor, said drain is connected to the gate of the first transistor, the source of the first transistor is connected to the gate and to the drain of a second transistor, and the source of the second transistor is connected to ground. Furthermore the circuit comprises a second load branch comprising a load and two CMOS transistors, wherein the load is connected between $V_{DD}$ voltage and the drain of a first transistor, the gate of the first transistor is connected to the gate of the first transistor of said biasing branch and the source of the first transistor is connected to the gate and to the drain of a second transistor and the source of the second transistor is connected to ground. Finally the circuit comprises a third measurement branch comprising a means of measurement and two CMOS transistors, wherein said means of measurement is connected between $V_{DD}$ voltage and the drain of a first transistor of the measurement branch, the gate of the first transistor is connected to the gate of the first transistor of the load branch, the source of the first transistor is connected to the drain of the second transistor, and the gate of the second transistor is connected to the gate of the second transistor of the load branch and the source of the second transistor is connected to ground.

In accordance with further objects of this invention a method to measure efficiently a load current in an integrated circuit using a current mirror configuration has been achieved. Said method comprises, firstly, providing a current mirror configuration having three branches, wherein a biasing branch is comprising a current source and two transistors, a load branch is comprising a load and two transistors, and a measurement branch is comprising a means of measurement and two transistors, and wherein the bias branch is connected to the load branch in a cascode mirror configuration and the measurement branch is also attached to the load branch in a cascode mirror configuration. The next steps of the method are to mirror the bias current to the current of the load branch, to mirror the load current to the current of the measurement branch and, finally, to measure the load current by measuring the linearly correlated current of the measurement branch.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel circuit and a related method to measure very efficiently the load current of current mirrors in an integrated circuit.

Figure 1:
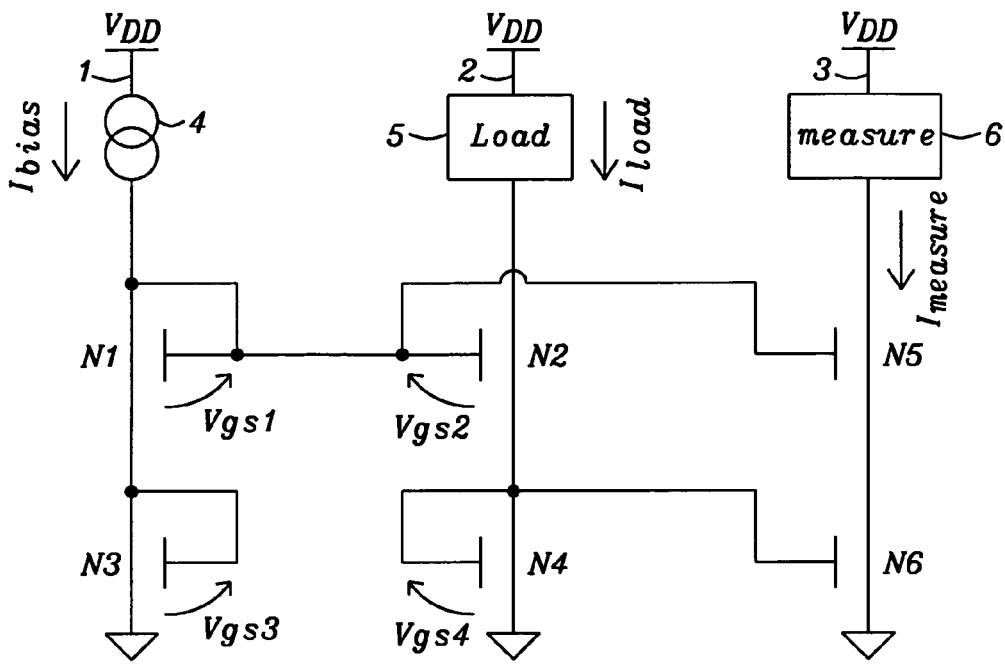
FIG. 1 shows a schematic of the circuit of the present invention.

FIG. 1 shows a principal schematic of the present invention. It shows a current mirror configuration having three branches, a biasing branch 1, a load branch 2, and a measurement branch 3. The biasing branch 1 is comprising a current source 4 and two NMOS transistors N1 and N3, wherein the source of N1 is connected to the drain of N3, the drain of N1 is connected to the current source 4 and to the gate of N1, and the source of N3 is connected to ground. The current source 4 is deployed between the supply voltage $V_{DD}$ and the drain of N1. The gate of N3 is connected to the drain of N3. The current $I_{BIAS}$ is flowing through branch 1. The current source 4 must have a voltage drop $V_{CS}$ that is smaller than the supply voltage $V_{DD}$ minus the gate-to source voltages of transistors N1 and N3:

$$V_{CS} < V_{DD} - (V_{GS1} + V_{GS3}),$$

wherein $V_{GS1}$ is the gate-to source voltage of transistor N1 and $V_{GS3}$ is the gate-to source voltage of transistor N3. In a preferred embodiment a PMOS transistor in a current mirror configuration has been implemented as a current source.

The load branch 2 is comprising a load 5 and two NMOS transistors N2 and N4, wherein the source of N2 is connected to the drain of N4, the drain of N2 is connected to the load 5, and the source of N4 is connected to ground. The current $I_{LOAD}$ is flowing through load branch 2. The gate of N1 is connected to the gate of N2 and to the drain of N1. The gate of N4 is connected to the drain of N4. The load 5 is deployed between $V_{DD}$ voltage and the drain of N2.

The load branch 2 behaves as a current mirror of the biasing branch 1, being attached to the biasing branch 2 in a cascode configuration. The following equation is valid:

$$\frac{W_2 \times L_1}{W_1 \times L_2} = \frac{W_4 \times L_3}{W_3 \times L_4},$$

wherein W1 is the channel width of transistor N1, L1 is the channel length of transistor N1, W2 is the channel width of transistor N2, L2 is the channel length of transistor N2 and wherein W3 is the channel width of transistor N3, L3 is the channel length of transistor N3, W4 is the channel width of transistor N4, L4 is the channel length of transistor N4.

The current gain $n_1$ of the current mirror comprising transistors N1 and N2 can be calculated according to the equation $$n_1 = \frac{W_2 \times L_1}{W_1 \times L_2} = \frac{W_4 \times L_3}{W_3 \times L_4}. \tag{1}$$

Using the gain $n_1$ according to equation (1) the current $I_{LOAD}$ is related to the current $I_{BIAS}$:

$$I_{LOAD} = n_1 \times I_{BIAS}.$$

In a preferred embodiment of the invention transistors N1, N2, N3 and N4 have the same channel length. Therefore the gain $n_1$ is defined in this case by the relation:

$$n1 = \frac{W_2}{W_1} = \frac{W_4}{W_3} \tag{2}$$

Transistors N1, N2, N3 and N4 operate in saturation. Transistors N1, N4 and N3 are diode connected (gate-to-drain voltage is zero). The sum of the gate-to source voltages $V_X$ of transistors N1 and N3 equals the sum of the gate-to source voltages of transistors N2 and N4:

$$V_{GS1} + V_{GS3} = V_{GS2} + V_{GS4} = V_X,$$

wherein $V_X$ is the voltage of the gates of N1 and N2.

The measurement branch 3 comprises a means of measurement 6 and two NMOS transistors N5 and N6, wherein the source of N5 is connected to the drain of N6, the drain of N5 is connected to the means of measurement 6 and the source of N6 is connected to ground. The gate of N5 is connected to the gate of N2. The gate of N6 is connected to the drain of N4 and also to the gate of N4. The means of measurement 6 is deployed between VDD voltage and the drain of N5.

Transistors N5 and N6 behave as a standard current mirror of the load branch 2, being attached to the load branch 2 in a cascode configuration.

The following equation is valid:

$$\frac{W_5 \times L_2}{W_2 \times L_5} = \frac{W_6 \times L_4}{W_4 \times L_6}, \tag{3}$$

wherein W5 is the channel width of transistor N5, L2 is the channel length of transistor N2, W2 is the channel width of transistor N2, L5 is the channel length of transistor N5 and wherein W6 is the channel width of transistor N6, L4 is the channel length of transistor N4, W4 is the channel width of transistor N4, L6 is the channel length of transistor N6.

Therefore the current $I_{MEASURE}$ through the measurement branch 3 of the current mirror configuration corresponds to the current $I_{LOAD}$ through the load branch 2 according to current gain n2:

$$n_2 = \frac{W_5 \times L_2}{W_2 \times L_5} = \frac{W_6 \times L_4}{W_4 \times L_6}, , . \tag{4}$$

In a preferred embodiment of the invention, transistors N2, N4, N5, and N6 have the same channel length. Therefore the current gain $n_2$ of the current mirror comprising transistors N2, N4, N5 and N6 can be calculated according to the equation:

$$n_2 = \frac{W_5}{W_2} = \frac{W_6}{W_4}. \quad (5)$$

Therefore the current through the measurement branch $$I_{MEASURE} = n_2 \times I_{LOAD}$$

can be used to measure the current through the load branch 2.

The gain from the load to the measurement branch is defined by equation (4). The current flowing in the load branch could be enlarged or downsized in the measurement branch, depending from the current value itself. Usually a small load current would be enlarged and a high load current would be downsized.

The accuracy of the measurement of the load current depends mainly from the manufacturing process variations affecting the dimensions of the transistors. Matching of the transistors is required during layout. Another parameter affecting the measured current is the channel length modulation. The cascode configuration of the measurement branch reduces this effect, but to reduce it even more, the transistors length must be increased to minimize the impact of process variations.

It is obvious to those skilled in art that the circuit shown in FIG. 1 could also be implemented using PMOS transistors instead of using NMOS transistors. Another alternative is to use bipolar transistors instead.

Figure 2:
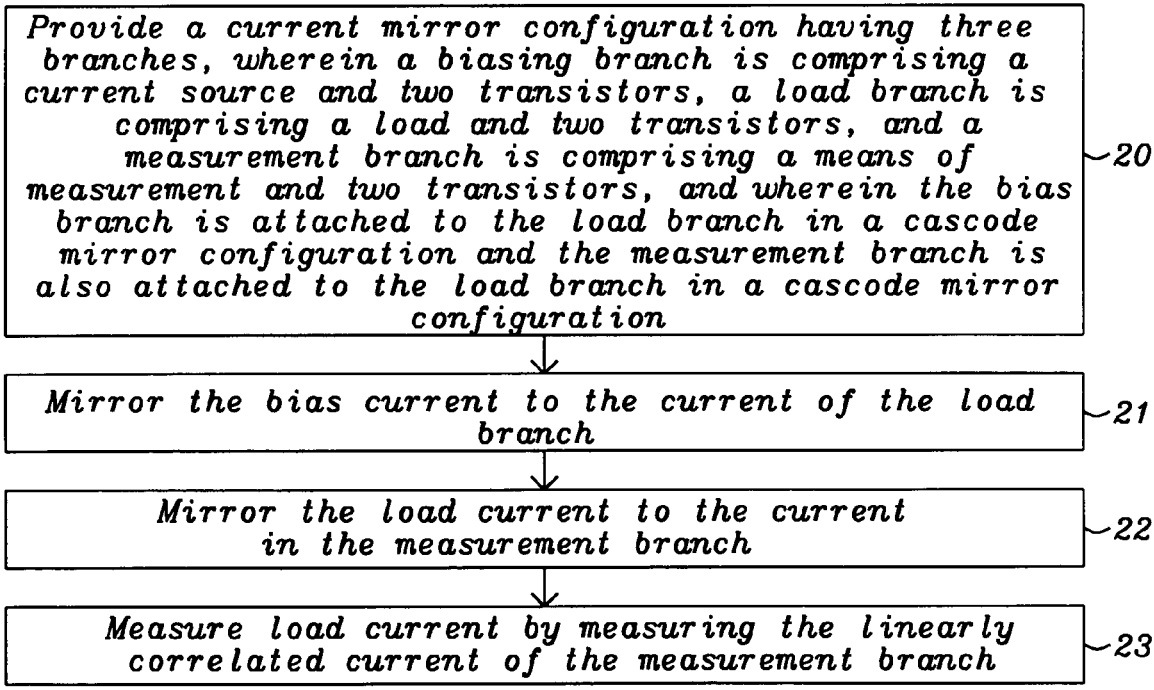
FIG. 2 illustrates a flowchart of a method to measure efficiently a load current in an integrated circuit.

FIG. 2 shows a flowchart of a method to measure efficiently a load current using a current mirror configuration, The first step 20 illustrates the provision of a current mirror configuration having three branches, wherein a biasing branch is comprising a current source and two transistors, a load branch is comprising a load and two transistors, and a measurement branch is comprising a means of measurement and two transistors, and wherein the bias branch is attached to the load branch in a cascode mirror configuration and the measurement branch is also attached to the load branch in a cascode mirror configuration. The next step 21 describes the mirroring of the bias current to the current of the load branch. The following step 22 illustrates the mirroring of the load current to the current of the measurement branch. The last step 23 shows the measurement of the load current by measuring the linearly correlated current of the measurement branch.

In summary a key point of the invention is that the load branch works at the same time as a mirror of the biasing branch and as a source for the measurement branch. The load branch is not affected or influenced from the measurement of its current.

While the invention has been particularly shown and described with reference to the preferred embodiments thereof, it will be understood by those skilled in the art that various changes in form and details may be made without departing from the spirit and scope of the invention.

What is claimed is:

1. A circuit of a current mirror configuration having three branches to measure a load current in an integrated circuit is comprising:
   a first biasing branch comprising a current source and a first and a second NMOS transistor, wherein the current source is connected between VDD voltage and the drain of the first transistor, said drain is connected to the gate of the first transistor, the source of the first transistor is connected to the gate and to the drain of the second transistor, and the source of the second transistor is connected to ground;
   a second load branch comprising a load and a first and a second NMOS transistor, wherein the load is connected between VDD voltage and the drain of the first transistor of the load branch, the gate of the first transistor of the toad branch is connected to the gate of the first transistor of said biasing branch and the source of the first transistor of the load branch is connected to the gate and to the drain of the second transistor of the load branch and the source of the second transistor of the load branch is connected to ground; and
   a third measurement branch in which a current, which is proportional to a current through said second load branch and can hence be used for measurement purposes, is generated, wherein said measurement branch is comprising a first and a second NMOS transistor, wherein the gate of the first transistor of the measurement branch is connected to the gate of the first transistor of the load branch, the source of the first transistor of the measurement branch is connected to the drain of the second transistor of the measurement branch, and the gate of the second transistor of the measurement branch is connected to the gate of the second transistor of the load branch and the source of the second transistor of the measurement branch is connected to ground.

2. The circuit of claim 1 wherein said first and second transistor of the biasing branch and said first and second transistor of the load branch have all the same channel width and the same channel length.

3. The circuit of claim 1 wherein said first and second transistor of the biasing branch and said first and second transistor of the load branch have all the same channel length with the following width relation:

$$n1 = \frac{W_2}{W_1} = \frac{W_4}{W_3},$$

wherein n1 is a current gain from a biasing current, W1 is a channel width of the said first transistor of the biasing branch, W2 is a channel width of said first transistor of the load branch, W3 is a channel width of said second transistor of the biasing branch, and W4 is a channel width of said second transistor of the load branch.

4. The circuit of claim 1 wherein said first and second transistor of the measurement branch and said two transistors of the load branch have all the same channel width and the same channel length.

5. The circuit of claim 1 wherein said two transistors of the load branch and said two transistors of the measurement branch have all the same channel length with the following width relation $$n2 = \frac{W_5}{W_2} = \frac{W_6}{W_4},$$

wherein n2 is a current gain from the biasing current, W5 is a channel width of the said first transistor of the measurement branch, W2 is a channel width of said first transistor of the load branch, W6 is a channel width of said second transistor of the measurement branch, and W4 is a channel width of said second transistor of the load branch.

6. The circuit of claim 1 wherein said first and second transistors of the biasing branch, said first and second transistors of the load branch and said first and second transistors of the measurement branch have all the same channel length and the same channel width.

7. The circuit of claim 1 wherein PMOS transistors are used instead of NMOS transistors.

8. The circuit of claim 1 wherein bipolar transistors are used instead of NMOS transistors.

9. A method to measure efficiently a load current in an integrated circuit using a current mirror configuration is comprising:

providing a current mirror configuration having three branches, wherein a biasing branch is comprising a current source and two transistors, a load branch is comprising a load and two transistors, and a measurement branch is comprising two transistors and wherein the bias branch is attached to the load branch in a mirror configuration and the measurement branch is also attached to the load branch in a mirror configuration;

mirroring the current of said biasing branch to the load branch;

mirroring the current of the load branch to the measurement branch; and, wherein the current through a first transistor of the load branch is mirrored to a first transistor of the measurement branch and the current of the second transistor of the load branch is mirrored to a second transistor of the measurement branch measuring the current of the load branch by measuring the current of the measurement branch, which is linearly correlated to the current of the load branch.

10. The method of claim 9 wherein the bias current is mirrored to the load current in a relation 1:1.

11. The method of claim 9 wherein the load current is mirrored to the measurement current in a relation 1:1.

12. The method of claim 9 wherein the current of the load branch is downsized in the measurement branch by using transistors in the measurement branch mirroring the current from the load branch, which have a smaller transistor area than the correspondent transistors of the load branch mirroring the current in the load branch to the measurement branch.

13. The method of claim 9 wherein the current of the load branch is enlarged in the measurement branch by using transistors in the measurement branch mirroring the current from the load branch, which have a larger transistor area than the correspondent transistors of the load branch mirroring the current in the load branch to the measurement branch.

* * * * *